US012259561B2

(12) United States Patent
Matsui et al.

(10) Patent No.: US 12,259,561 B2
(45) Date of Patent: Mar. 25, 2025

(54) SPOT-SIZE CONVERTER

(71) Applicant: II-VI Delaware, Inc., Wilmington, DE (US)

(72) Inventors: Yasuhiro Matsui, Milpitas, CA (US); Shiyun Lin, San Diego, CA (US); David Adams, Stockholm (SE)

(73) Assignee: II-VI DELAWARE, INC.

( * ) Notice: Subject to any disclaimer, the term of this patent is extended or adjusted under 35 U.S.C. 154(b) by 0 days.

(21) Appl. No.: 18/427,704

(22) Filed: Jan. 30, 2024

(65) Prior Publication Data
US 2024/0201507 A1 Jun. 20, 2024

Related U.S. Application Data

(63) Continuation of application No. 17/028,942, filed on Sep. 22, 2020, now Pat. No. 11,921,298.

(51) Int. Cl.
G02B 6/122 (2006.01)
G02B 6/10 (2006.01)
G02B 27/09 (2006.01)
H01S 5/026 (2006.01)
H01S 5/042 (2006.01)
H01S 5/12 (2021.01)
H01S 5/22 (2006.01)

(52) U.S. Cl.
CPC ............ G02B 27/095 (2013.01); G02B 6/10 (2013.01); G02B 6/1228 (2013.01); H01S 5/026 (2013.01); H01S 5/12 (2013.01); H01S 5/22 (2013.01); H01S 5/2206 (2013.01); H01S 5/0424 (2013.01)

(58) Field of Classification Search
CPC ...... H01S 5/026; H01S 5/0424; G02B 6/1228
See application file for complete search history.

(56) References Cited

U.S. PATENT DOCUMENTS 5,693,965 A 12/1997 Yamada
5,739,543 A 4/1998 Shimizu et al.
6,162,655 A 12/2000 Johnson et al.
(Continued)

OTHER PUBLICATIONS

Tsuchizawa, Tai , et al., "Microphotonics Devices Based on Silicon Microfabrication Technology", IEEE Journal of Selected Topics in Quantum Electronics, vol. 11, No. 1, pp. 232-240. (Year: 2005).

Primary Examiner — Michael Carter
(74) Attorney, Agent, or Firm — Blank Rome LLP

(57) ABSTRACT

A spot-size converter includes first and second waveguide structures. The first waveguide structure extends longitudinally along a waveguide axis from a first end to a second end and is configured to support a first optical mode at the first end. The second waveguide structure is formed within the first waveguide structure. The second waveguide structure extends longitudinally between the first end and the second end. The second waveguide structure is configured to support a second optical mode at the second end. The second optical mode has a different diameter than the first optical mode. The second waveguide structure includes a waveguide core that has a first cross-sectional area in a first plane normal to the waveguide axis at the first end and a second cross-sectional area in a second plane normal to the waveguide axis at the second end. The second cross-sectional area is larger than the first cross-sectional area.

20 Claims, 13 Drawing Sheets

(56) References Cited

U.S. PATENT DOCUMENTS

| | | | | |
|---|---|---|---|---|
| 7,251,406 | B2* | 7/2007 | Luo | G02B 6/1228 |
| | | | | 385/28 |
| 8,236,590 | B2 | 8/2012 | Matsui et al. | |
| 9,698,570 | B2* | 7/2017 | Takabayashi | H01S 5/1014 |
| 2001/0030327 | A1* | 10/2001 | Furushima | H01S 5/227 |
| | | | | 438/31 |
| 2015/0247974 | A1 | 9/2015 | Painchaud et al. | |
| 2016/0041340 | A1* | 2/2016 | Shi | G02B 6/1228 |
| | | | | 385/14 |
| 2017/0047710 | A1* | 2/2017 | Oh | H01S 5/1014 |
| 2017/0104309 | A1* | 4/2017 | Kimura | H01S 5/1064 |
| 2019/0219760 | A1* | 7/2019 | Kim | G02B 6/122 |
| 2019/0293878 | A1 | 9/2019 | Mahgerefteh et al. | |

* cited by examiner

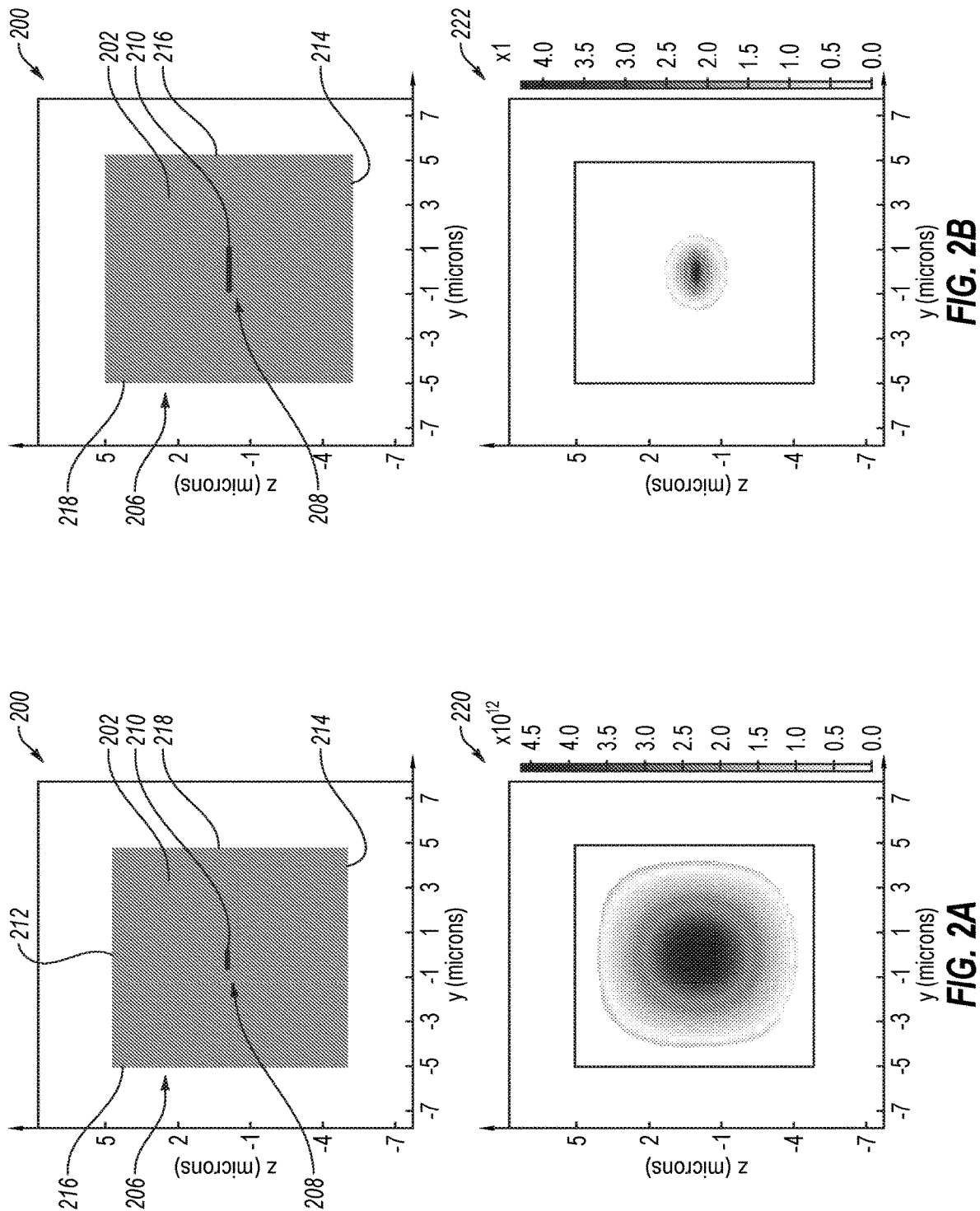

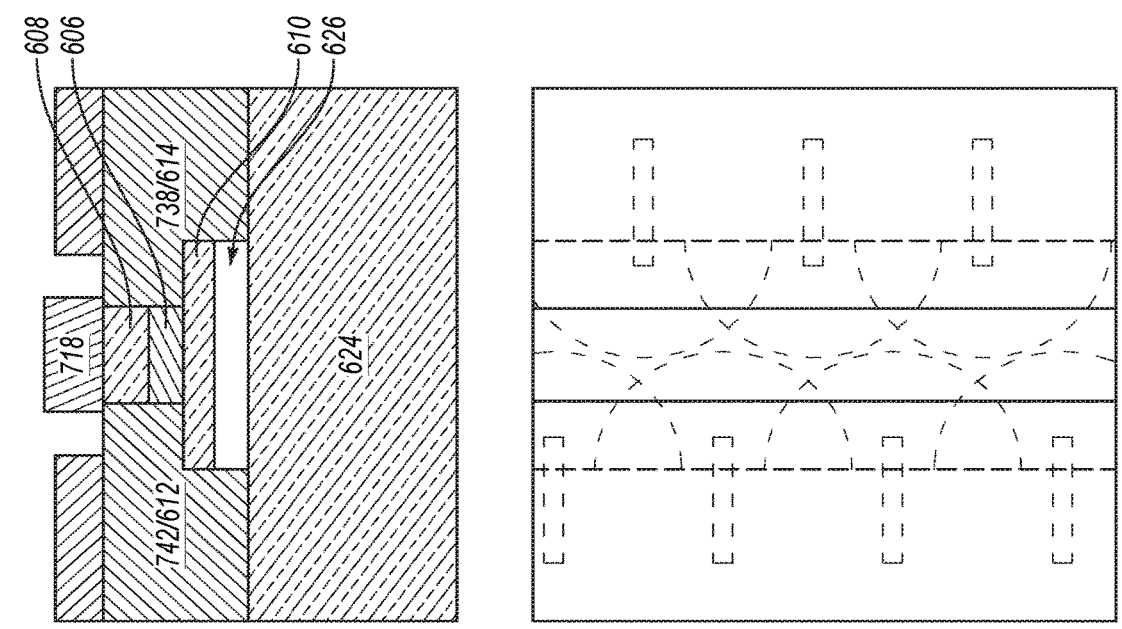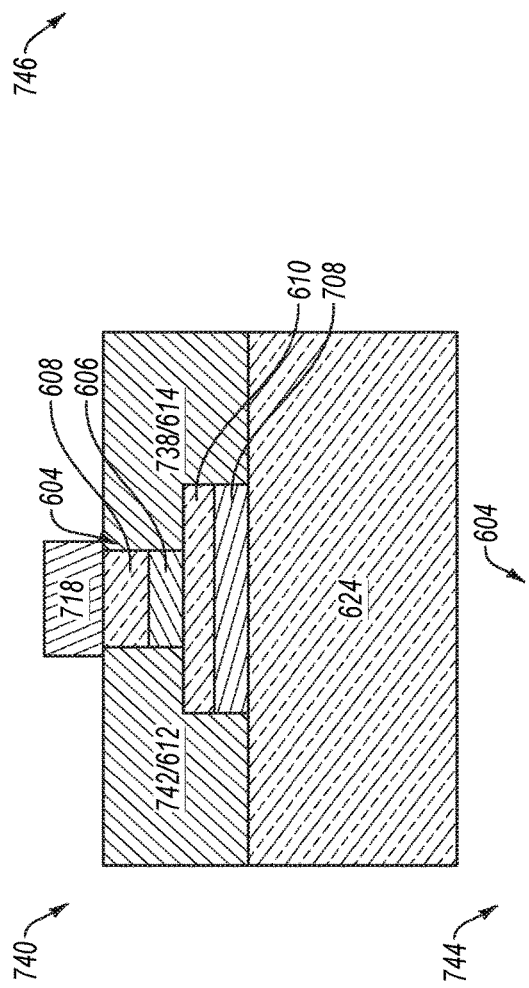
FIG. 7G
FIG. 7H

SPOT-SIZE CONVERTER

CROSS-REFERENCE TO RELATED APPLICATIONS

This application is a continuation of U.S. patent application Ser. No. 17/028,942, filed Sep. 22, 2020, the entire contents of which are hereby incorporated by reference herein.

FIELD

The embodiments discussed herein are related to a spot-size converter (SSC).

BACKGROUND

Unless otherwise indicated herein, the materials described herein are not prior art to the claims in the present application and are not admitted to be prior art by inclusion in this section.

Optical mode beam diameter of a typical directly modulated laser (DML) or externally modulated laser (EML) is about 1.5 micrometers. Optical mode beam diameter of a typical single mode fiber (SMF) is about 10 micrometers. To launch light from a DML or EML into a SMF, the optical mode beam diameter of the DML or EML is typically increased, e.g., by a SSC, to better match the optical mode beam diameter of the SMF, which may reduce coupling losses.

The subject matter claimed herein is not limited to implementations that solve any disadvantages or that operate only in environments such as those described above. Rather, this background is only provided to illustrate one example technology area where some implementations described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described herein generally relate to a SSC.

In an example embodiment, a spot-size converter includes first and second waveguide structures. The first waveguide structure extends longitudinally along a waveguide axis from a first end to a second end and is configured to support a first optical mode at the first end. The second waveguide structure is formed within the first waveguide structure. The second waveguide structure extends longitudinally between the first end and the second end. The second waveguide structure is configured to support a second optical mode at the second end. The second optical mode has a different diameter than the first optical mode. The second waveguide structure includes a waveguide core that has a first cross-sectional area in a first plane normal to the waveguide axis at the first end and a second cross-sectional area in a second plane normal to the waveguide axis at the second end. The second cross-sectional area is larger than the first cross-sectional area.

In another example embodiment, an optical system includes an active optical element and a SSC. The active optical element includes an active layer configured to convert electrical current to light or to convert light to electrical current. The SSC is optically coupled to the active optical element and includes a box structure and a waveguide core. The box structure extends between first and second ends. At least one surface of the box structure is clad by air. The box structure is coupled to the active optical element at the second end of the box structure. The waveguide core is encapsulated within the box structure and extends from the second end toward the first end along a waveguide axis. The waveguide core is clad by the box structure and is optically coupled at the second end to the active layer of the active optical element. At least one of a transverse dimension of the waveguide core or a lateral dimension of the waveguide core decreases along the waveguide axis from the second end toward the first end. The transverse and lateral dimensions at any point along the waveguide axis define a plane that is normal to the waveguide axis.

In another example embodiment, a monolithically formed laser and SSC includes a laser and a SSC. The laser includes a substrate, a lower cladding formed above the substrate, an active layer formed above the lower cladding, and an upper cladding formed above the active layer. The SSC includes the substrate and first and second waveguide structures. The first waveguide structure extends from the laser to a facet end. The first waveguide structure includes the lower cladding and the upper cladding that each extend continuously through the laser and the SSC. The second waveguide structure extends from the laser toward the facet end. The second waveguide structure includes a waveguide core optically coupled to the active layer of the laser. A cross-sectional area normal to the waveguide axis of the waveguide core decreases from the laser approaching the facet end.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 2A-2B include end views of another example SSC;

FIGS. 7A-7H illustrate an example set of epitaxial processing steps to form the laser of FIG. 6 monolithically with a SSC, all arranged in accordance with at least one embodiment described herein.

DETAILED DESCRIPTION OF SOME EXAMPLE EMBODIMENTS

Figure 1A:
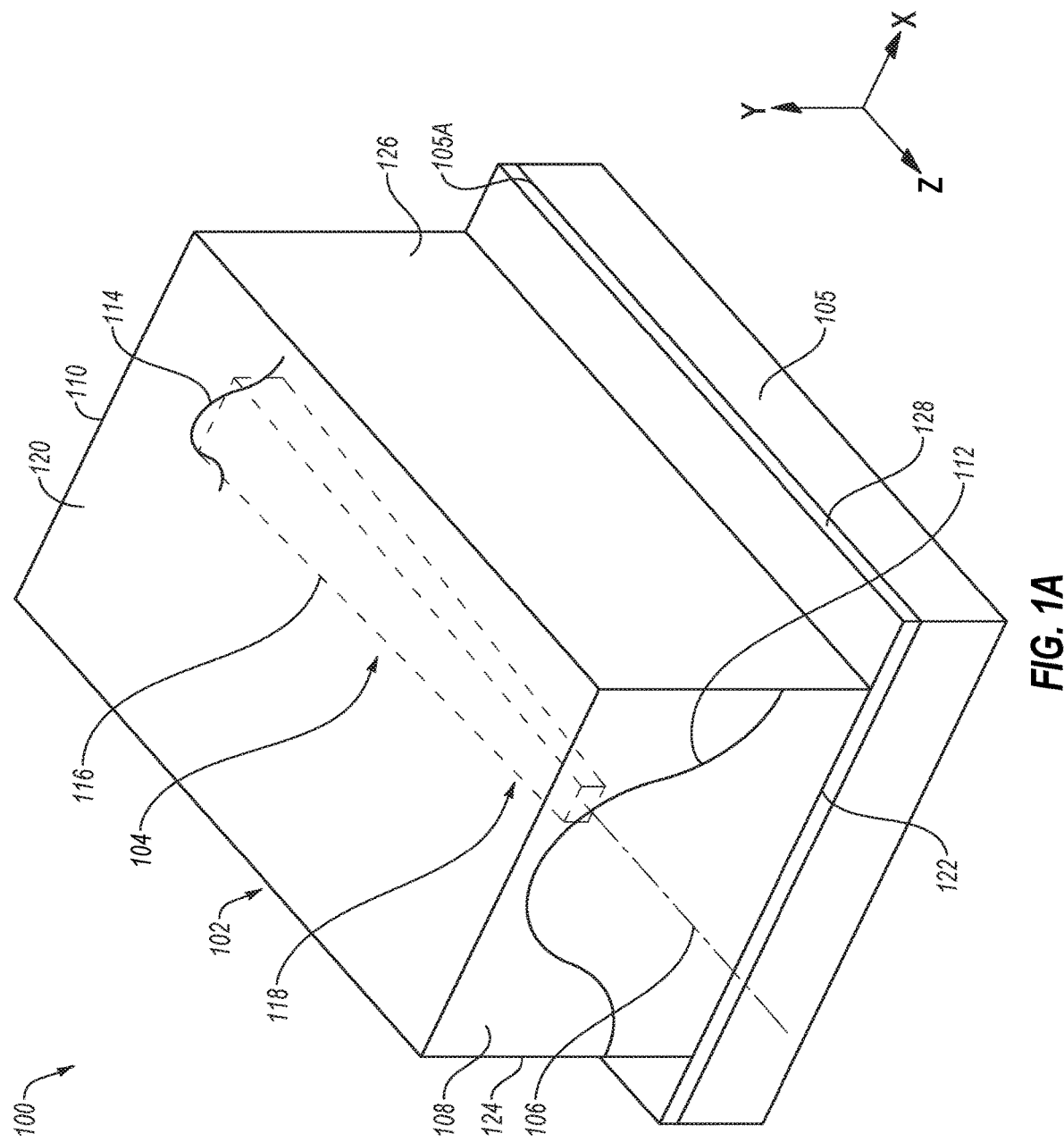
FIG. 1A includes a perspective view of an example SSC.

The term "light" as used herein is to be construed broadly as any electromagnetic radiation that may be used for optical communication. Accordingly, light may include electromagnetic radiation in the O-band (~1261 nanometers (nm) to 1361 nm), the E-band (~1361 nm to 1461 nm), the S-band (~1461 nm to 1531 nm), the C-band (1531 nm to 1561 nm), the L-band (1561 nm to 1625 nm), the 850 nm band, or other wavelength bands.

Some embodiments herein relate to a SSC that gradually weakens optical confinement in a waveguide core by down-tapering the waveguide core along a light propagation direction. The gradually weakening optical confinement of the waveguide core allows the optical mode to expand and be released from the waveguide core into a box structure. The waveguide core is surrounded or clad by the box structure. The box structure has a lower refractive index than the waveguide core. In turn, the box structure is surrounded or clad by air or other material with a lower refractive index than the box structure. As such, the optical mode released into the box structure is confined within the box structure.

The SSC supports a first optical mode at a first end of the SSC where the waveguide core has a first cross-sectional area normal to the light propagation direction and a second, smaller, optical mode at a second end of the SSC where the waveguide core has a second, larger, cross-sectional area normal to the light propagation direction. The first optical mode may have a beam diameter of about 10 micrometers (e.g., 3 to 12 micrometers) and the second optical mode may have a beam diameter of about 1.5 micrometers (e.g., 1.2 to 1.8 micrometers). Thus, the SSC may be configured to convert the optical mode of light output by a DML or EML to a larger optical mode that matches the optical mode of a SMF or another waveguide. Two optical modes may be said to match if their profiles overlap by at least 70%, at least 80%, at least 90%, or some other threshold.

The waveguide core of the SSC may be tapered laterally, transversely, or both in the light propagation direction. Alternatively or additionally, the waveguide core may include a grating portion at the first end of the SSC with a duty cycle that gradually increases, e.g., to 90%, in the light propagation direction.

The SSC may be suspended above a substrate by one or more pillars such that a bottom surface of the box structure is clad by air in an air gap between the SSC and the substrate. Alternatively, an index step material layer may be disposed between the bottom surface of the box structure and the substrate and the pillars may be omitted.

In some embodiments, the SSC may be formed on the same substrate as an active optical element, such as a laser or photodiode, to which the SSC is optically coupled in an optical system. Further, the SSC may be formed by at least some of the same processing steps as used to form the active optical element. In an example, the active optical element includes a laser, such as a distributed feedback (DFB) laser. Alternatively or additionally, the DFB laser may include a lateral junction buried heterostructure (BH).

Some embodiments include an optical system with a laser, a SSC as described herein, a silicon (Si) photonic integrated circuit (PIC), and an edge coupler positioned to receive light output by the SSC and couple the light into the Si PIC. Such an optical system may exhibit less optical loss than otherwise similar optical systems that include a conventional SSC, which may reduce required output of the laser, e.g., by 2 decibels (dB) or other amount. The reduced output power may improve reliability of the laser.

Embodiments of the SSC are generally described herein in the context of coupling light out of a laser with spot size conversion to a larger optical mode. Embodiments of the SSC may alternatively or additionally be used in the context of coupling light into a photodiode with spot size conversion to a smaller optical mode.

Reference will now be made to the drawings to describe various aspects of example embodiments of the invention. The drawings are diagrammatic and schematic representations of such example embodiments, and are not limiting of the present invention, nor are they necessarily drawn to scale.

FIG. 1A includes a perspective view of an example SSC 100, arranged in accordance with at least one embodiment described herein. The SSC 100 may generally include a first waveguide structure 102 and a second waveguide structure 104 formed on or spaced apart from a substrate 105.

As illustrated, the first waveguide structure 102 extends longitudinally along a waveguide axis 106 from a first end 108 to a second end 110 of the SSC 100. As used herein, terms such as longitudinal, length, and variants refer to the light propagation direction or waveguide axis 106. Terms such as transverse, height, thickness, top, bottom, and variants refer to a direction normal to the light propagation direction and normal to a surface 105A of the substrate 105 on or spaced apart from which other layers of the SSC 100 are formed. Terms such as lateral, width, side, and variants refer to a direction normal to both the light propagation direction and the transverse direction. An arbitrarily defined x-y-z axis is included in FIG. 1A for reference where the z axis is parallel to the longitudinal direction, the y axis is parallel to the transverse direction, and the x axis is parallel to the lateral direction.

The first waveguide structure 102 may include a box structure that includes one or more semiconductor materials or other materials. In an example, the box structure includes undoped indium phosphide (InP). In another example, a portion of the box structure may be n-doped, e.g., in a range of $3 \times 10^{17}$ cm$^{-3}$ to $5 \times 10^{17}$ cm$^{-3}$, which may facilitate monolithic integration of the SSC 100 with a laser or photodetector. The first waveguide structure 102 may be configured to support a first optical mode, generally designated at 112, at the first end 108. The first optical mode 112 may have a beam diameter of about 10 micrometers, or in a range from 3 to 12 micrometers, or some other beam diameter.

The second waveguide structure 104 is formed within the first waveguide structure 102 and may include part of the first waveguide structure 102. The second waveguide structure 104 may extend longitudinally between the first end 108 and the second end 110 and may be configured to support a second optical mode, generally designated at 114, at the second end 110. The second optical mode 112 has different dimensions than the first optical mode 112. For example, the second optical mode 112 may have a beam diameter of about 1.5 micrometers, or in a range from 1.2 to 1.8 micrometers, or some other beam diameter.

The second waveguide structure 104 includes a waveguide core 116 and at least some cladding of the first waveguide structure 102 that surrounds the waveguide core 116. The waveguide core 116 may extend from the second end 110 toward the first end 108. The waveguide core 116 may reach the first end 108 or the waveguide core 116 may terminate before reaching the first end 108 as illustrated in FIG. 1A. The waveguide core 116 may have a higher index of refraction than the cladding. The waveguide core 116 may or may not be visible within the first waveguide structure 102 and thus the waveguide core 116 is illustrated with dashed lines.

The waveguide core 116 is configured to release light from the second waveguide structure 104 into the first waveguide structure 102. Accordingly, a configuration of the waveguide core 116 may vary along the waveguide axis 106 such that the optical confinement provided by the second waveguide structure 104 varies along the waveguide axis 106 from, e.g., relatively weak or zero confinement at the first end 108 to relatively strong confinement at the second end 110.

In this and other examples, the waveguide core may taper from the first end 108 to the second end 110 may inverse taper from the second end 110 to the first end 108. Tapers and inverse tapers are structurally equivalent, the difference being whether a cross-sectional area of the waveguide core 116 normal to the light propagation direction (e.g., parallel to the x-y plane in FIG. 1A) increases or decreases in the light propagation direction. For light that propagates through the second waveguide structure 104 from the first end 108 to the second end 110 such that the cross-sectional area of the waveguide core 116 increases in the light propagation direction, the waveguide core 116 has a taper. On the other hand, for light that propagates through the second waveguide structure 104 from the second end 110 to the first end 108 such that the cross-sectional area of the waveguide core 116 decreases in the light propagation direction, the waveguide core 116 has an inverse taper. For simplicity herein, the term "taper" and its variants should be broadly construed as a variation of one or both of a lateral or transverse dimension of the waveguide core 116 along the waveguide axis 106. The lateral dimension or the transverse dimension may vary linearly or nonlinearly or in segments of linear and nonlinear variation.

Instead of or in addition to being tapered at the first end 108 of the SSC 100, the waveguide core 116 may include a grating portion, generally designated at 118 in FIG. 1A, that decreases optical confinement of the waveguide core 116 along the waveguide axis 106 moving toward the first end 108. The grating portion 118 may extend nearer to the first end 108 than a remainder of the waveguide core 116. The remainder of the waveguide core 116 may include a continuous length of core material with a core index of refraction. The grating portion 118 may include grating lines of core material that alternate with a second material that is different than the core material. The second material has a second index of refraction that is different than the core index of refraction. The second material may include the same material as the cladding of the first waveguide structure 102 or other material. The grating lines may be arranged at an angle to the waveguide axis 106. The angle may be in a range from 20-90 degrees, 30-80 degrees, 40-70 degrees, or in some other range.

Each grating line and alternating section of second material of the grating portion 118 has a longitudinal dimension along the waveguide axis 106. A duty cycle of the grating portion 118 may be defined as a ratio of the longitudinal dimension of a section of second material to a period of the grating portion 118. The period may be defined as the longitudinal distance from one core-to-second material interface through a second material-to-core interface to a next core-to-second material interface. In some embodiments, the duty cycle may gradually increase moving toward the first end 108. For example, the duty cycle of the grating portion 118 of the waveguide core 116 may gradually increase along the waveguide axis 106 to 90% at the first end 108.

The first waveguide structure 102 may include the cladding that encapsulates and surrounds the waveguide core 116. The cladding of the first waveguide structure 102 may have opposing transverse surfaces 120, 122 and opposing lateral surfaces 124, 126. The transverse surfaces 120, 122 may also be referred to as top and bottom surfaces 120, 122. In some embodiments, one or more of the surfaces 120, 122, 124, 126 may be clad by air or other material with an index of refraction lower than that of the cladding. In the illustrated example, the top surface 120 and the lateral surfaces 124, 126 are clad by air, while the bottom surface 122 is clad by an index step material layer 128 disposed between the substrate 105 and the bottom surface 122. More generally, some or all of the surfaces 120, 122, 124, 126 may be clad by air or index step material, or both.

In some embodiments, index step material includes the same material as the cladding with one or more added dopants such that the index step material has a different index of refraction than the cladding. As an example, the cladding may include InP and the index step material layer 128 may include doped InP. As another example, lower cladding, e.g., a portion of the cladding that is generally beneath the waveguide core 116, may be n-doped, e.g., in a range of $3 \times 10^{17}$ $cm^{-3}$ to $5 \times 10^{17}$ $cm^{-3}$, and the index step material layer 128 may also be n-doped but to a greater degree than the lower cladding, e.g., in a range of $2 \times 10^{18}$ $cm^{-3}$ to $5 \times 10^{18}$ $cm^{-3}$. In embodiments described herein, the index step material layer 128 may have a lower index of refraction than the cladding of the first waveguide structure 102.

Figure 1B:
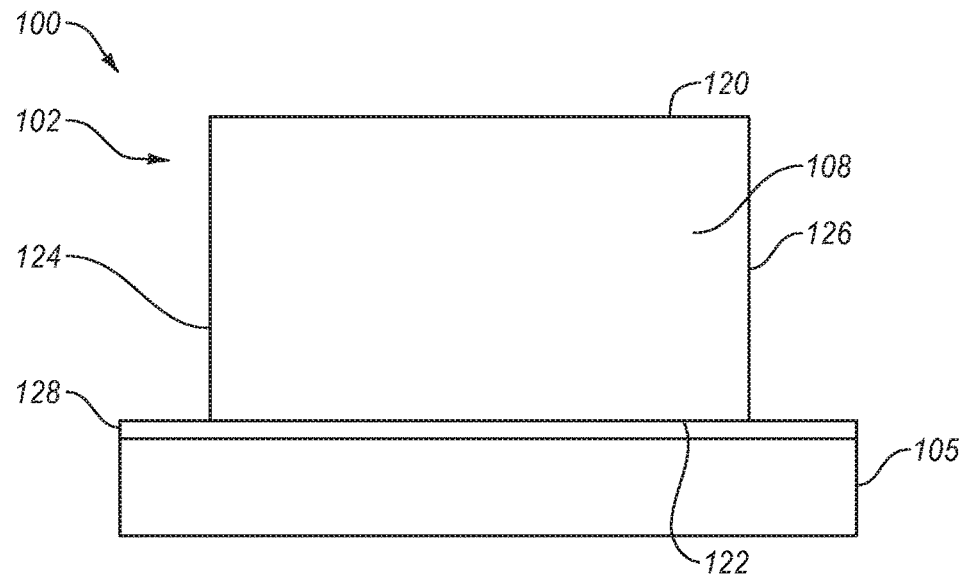
FIG. 1B includes an end view of the SSC of FIG. 1A.

FIG. 1B includes an end view of the SSC 100 of FIG. 1A, arranged in accordance with at least one embodiment described herein. In particular, FIG. 1B includes a view of the first end 108 of the SSC 100.

Figure 1C:
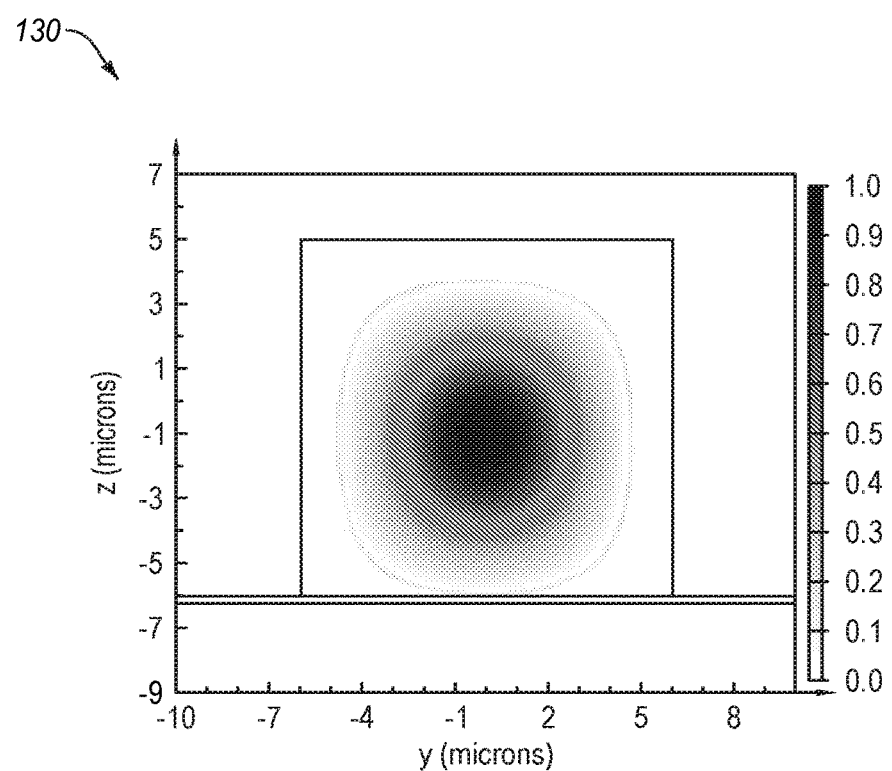
FIG. 1C includes a simulated optical mode at a first end of the SSC of FIG. 1A.

FIG. 1C includes a simulated optical mode 130 at the first end 108 of the SSC 100, arranged in accordance with at least one embodiment described herein. It can be seen from the simulated optical mode 130 of FIG. 1C that the optical mode is confined within the first waveguide structure 102 at the first end 108 and is not confined, or is only weakly confined, by the second waveguide structure 104 (not visible in FIG. 1C).

FIGS. 2A-2B include end views of another example SSC 200, arranged in accordance with at least one embodiment described herein. The SSC 200 may include, be included in, or correspond to other SSCs described herein. FIG. 2A includes an end view of a first end 202 of the SSC 200 that may be the same as or similar to the first end 108 of the SSC 100 of FIGS. 1A-1C. FIG. 2B includes an end view of a second end 204 of the SSC 200 that may be the same as or similar to the second end 110 of the SSC 100 of FIGS. 1A-1C.

The SSC 200 of FIGS. 2A-2B, similar to the SSC 100, may include a first waveguide structure 206 that includes cladding and a second waveguide structure 208 formed within the first waveguide structure 206, the second waveguide structure 208 including a waveguide core 210 surrounded by the cladding of the first waveguide structure 206. A cross-sectional area of the waveguide core 210 normal to the light propagation direction is greater at the second end 204 than the first end 202. The cross-sectional area of the waveguide core 210 may gradually decrease from the second end 204 to the first end 202. Alternatively or additionally, the waveguide core 210 may include a grating portion at or near the first end 202 that is nearer to the first end 202 than a remainder of the waveguide core 210.

The cladding of the first waveguide structure 208 has opposing transverse surfaces 212, 214 and opposing lateral surfaces 216, 218. The transverse surfaces 212, 214 may also be referred to as top and bottom surfaces 212, 214. In the illustrated example, all of the surfaces 212, 214, 216, 218 are clad by air.

FIGS. 2A and 2B additionally included simulated optical modes of the SSC 200. In particular, FIG. 2A includes a simulated optical mode 220 at the first end 202 of the SSC 200 and FIG. 2B includes a simulated optical mode 220 at the second end 204 of the SSC 200. It can be seen from the simulated optical mode 222 of FIG. 2B that the optical mode is strongly confined within the second waveguide structure 208 at the second end 204. It can be seen from the simulated optical mode 220 of FIG. 2A that the optical mode is confined within the first waveguide structure 206 at the first end 202 and is not confined, or is weakly confined, by the second waveguide structure 208.

Figure 3A:
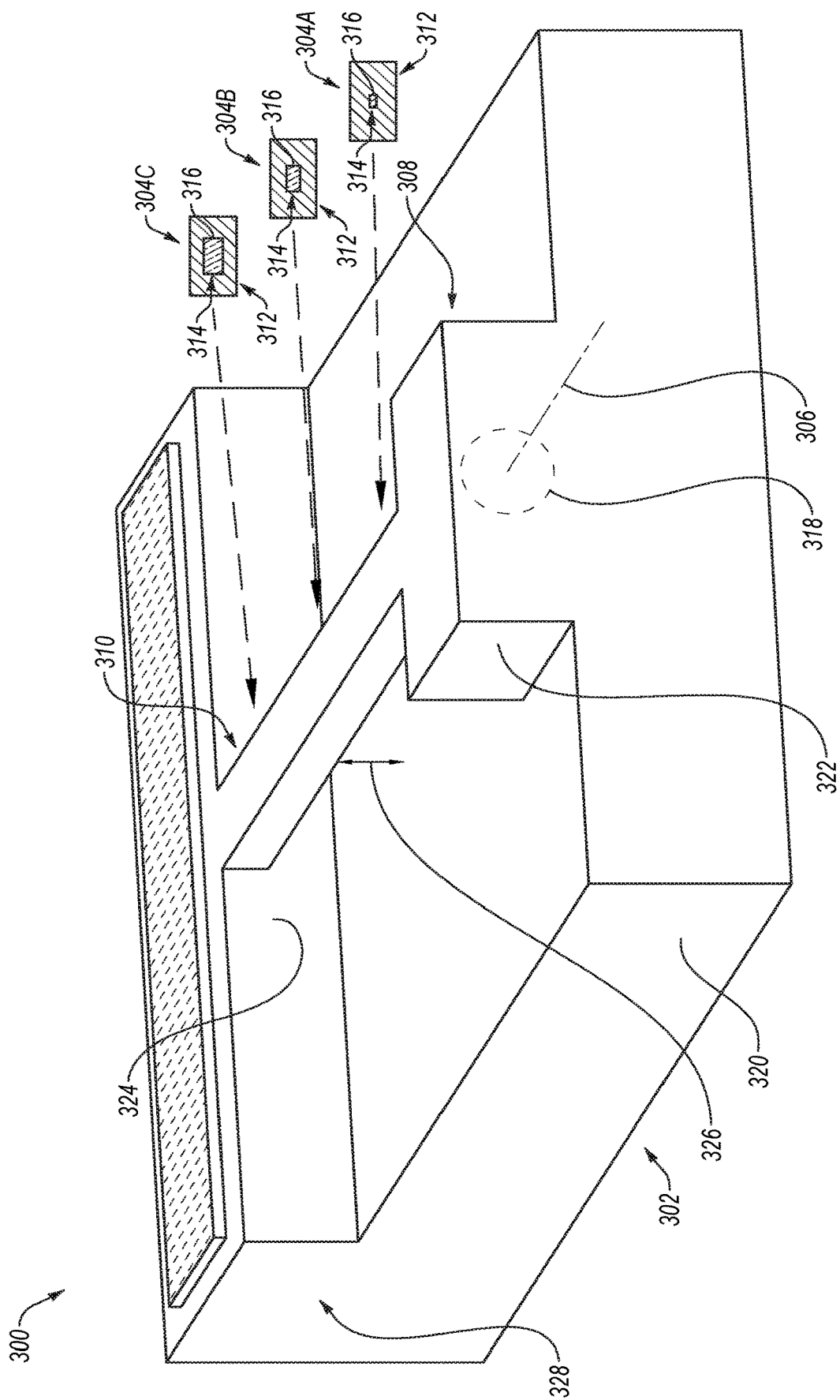
FIG. 3A includes a perspective view of an example optical system that includes a SSC.

FIG. 3A includes a perspective view of an example optical system 300 (hereinafter "system 300") that includes a SSC 302, arranged in accordance with at least one embodiment described herein. FIG. 3A additionally includes example cross-sectional views 304A, 304B, 304C (collectively "cross-sectional views 304") of the SSC 302 at different axial locations of the SSC 302 and in planes normal to a waveguide axis 306 of the SSC 302. The locations of the cross-sections are generally indicated by arrows from the cross-sectional views 304. The cross-sectional view 304A is from a location at or near a first end 308 of the SSC 302. The cross-sectional view 304C is from a location at or near a second end 310 of the SSC 302. The cross-sectional view 304B is from a location between the first and second ends 308, 310.

The SSC 302 may include, be included in, or correspond to other SSCs described herein. For example, as illustrated in the cross-sectional views 304, the SSC 302 may generally include first and second waveguide structures 312, 314 that extend between the first and second ends 308, 310. The first waveguide structure 312 includes cladding. The second waveguide structure 314 is formed within the first waveguide structure 312 and includes a waveguide core 316. It can be seen from the cross-sectional views 304 that a cross-sectional area of the waveguide core 316 normal to the waveguide axis 306 increases in the direction from the first end 308 to the second end 310. Alternatively or additionally, the waveguide core 316 may include a grating portion at or near the first end 308. The SSC 302 may include a first optical mode at the first end 308, generally designated at 318. The first optical mode 318 may be larger than a second optical mode (not shown) of the SSC 302 at the second end 310.

In the example of FIG. 3A, opposing transverse surfaces and opposing lateral surfaces of the first waveguide structure 312 of the SSC 302 are clad by air. Accordingly, the SSC 302 may include one or more supports to support the first waveguide structure 312 spaced apart from a substrate 320 on which the SSC 302 is formed. For example, the SSC 302 may include a first support 322 that supports the first end 308 of the SSC 302 spaced apart from the substrate 320. Alternatively or additionally, the SSC 302 may include a second support 324 that supports the second end 310 spaced apart from the substrate 320.

Each of the supports 322, 324 may include any suitable component, material, or structure. In an example, each of the supports 322, 324 includes one or more epitaxial layers formed on the substrate 320. Alternatively or additionally, the first and second waveguide structures 312, 314 of the SSC 302 may include one or more of the same epitaxial layers of the supports 322, 324 that are etched or otherwise processed to form the first and second waveguide structures 312, 314 spaced apart from the substrate 320 with an air gap 326 between the substrate and a surface e.g., a bottom surface, of the first waveguide structure 312 that is spaced apart from and faces the substrate 320.

The system 300 may additionally include an active optical element 328 with an active layer configured to convert electrical current to light or to convert light to electrical current. For example, the active optical element 328 may include a laser with a multiple quantum well (MQW) gain layer that converts electrical current to light or a positive-intrinsic-negative (PIN) photodiode with a stack of positive, intrinsic, and negative layers that convert light to electrical current. As illustrated, the SSC 302 and the active optical element 328 share the substrate 320. In some embodiments, the SSC 302 and the active optical element 328 may be formed from one or more of the same epitaxial layers or in one or more of the same epitaxial processing steps. Accordingly, the system 300 may be or include a monolithically formed active optical element and SSC, a monolithically formed laser and SSC, or a monolithically formed photodiode and SSC.

The SSC 302 is generally configured to convert the optical mode of an optical beam traveling in the direction of the waveguide axis 306 from, e.g., the second optical mode at the second end 310 to the first optical mode 318 at the first end 308 (or vice versa). The first support 322 may be implemented to support the first end 308 without undue distortion of the emitted optical beam. In this and other embodiments, the first support 322 may have a length of 4-10 micrometers. It can be seen from FIG. 3A that the first support 322 is wider in the lateral dimension than the first waveguide structure 312 and extends to the substrate 320. This configuration of the first support 322 "releases" both the lateral waveguiding (due to the wider lateral dimension of the first support 322 than the first waveguide structure 312) and the vertical waveguiding lower boundary (due to the first support 322 extending to the substrate 320), over the 4-10 micrometer length of the first support 322. However, at the first end 308 of the SSC 302, the optical mode of the optical beam essentially fills the first waveguide structure 312 (e.g., has the first optical mode 318) and is large enough to be well collimated. As such, the optical beam does not diffract rapidly along the length of the first support 322 where the lateral boundaries and the lower vertical boundary of the first waveguide structure 312 are briefly removed and is therefore not unduly distorted by the first support 322.

Figure 3B:
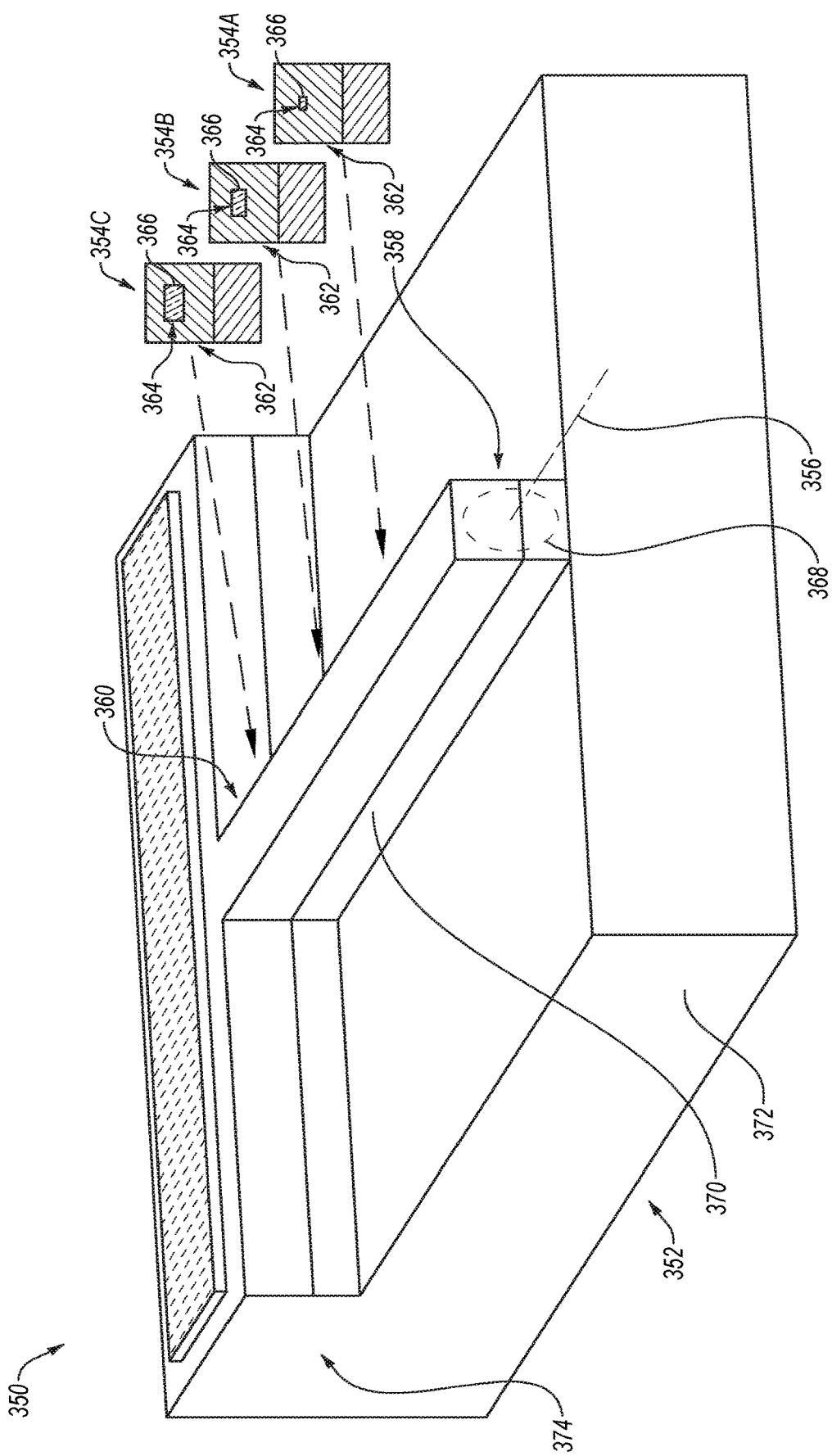
FIG. 3B includes a perspective view of another example optical system that includes a SSC.

FIG. 3B includes a perspective view of another example optical system 350 (hereinafter "system 350") that includes a SSC 352, arranged in accordance with at least one embodiment described herein. FIG. 3B additionally includes example cross-sectional views 354A, 354B, 354C (collectively "cross-sectional views 354") of the SSC 352 at different axial locations of the SSC 352 and in planes normal to a waveguide axis 356 of the SSC 352. The locations of the cross-sections are generally indicated by arrows from the cross-sectional views 354. The cross-sectional view 354A is from a location at or near a first end 358 of the SSC 352. The cross-sectional view 354C is from a location at or near a second end 360 of the SSC 352. The cross-sectional view 354B is from a location between the first and second ends 358, 360.

The SSC 352 may include, be included in, or correspond to other SSCs described herein. For example, as illustrated in the cross-sectional views 354, the SSC 352 may generally include first and second waveguide structures 362, 364 that extend between the first and second ends 358, 360. The first waveguide structure 362 includes cladding. The second waveguide structure 364 is formed within the first waveguide structure 362 and includes a waveguide core 366. It can be seen from the cross-sectional views 354 that a cross-sectional area of the waveguide core 366 normal to the waveguide axis 356 increases in the direction from the first end 358 to the second end 360. Alternatively or additionally, the waveguide core 366 may include a grating portion at or near the first end 358. The SSC 352 may include a first optical mode at the first end 358, generally designated at 368. The first optical mode 368 may be larger than a second optical mode (not shown) of the SSC 352 at the second end 360.

In the example of FIG. 3B, opposing lateral surfaces and a transverse surface (e.g., a top surface) of the first waveguide structure 362 of the SSC 352 are clad by air. In addition, the other transverse surface (e.g., a bottom surface) of the first waveguide structure 362 is clad by an index step material layer 370 disposed between the first waveguide structure 362 and a substrate 372 on which the SSC 352 is formed. In some examples, the index step material layer 370 is formed on the substrate 372 and the first and second waveguide structures 362, 364 are formed on the index step material layer 370.

The system 350 may additionally include an active optical element 374 with an active layer configured to convert electrical current to light or to convert light to electrical current. For example, the active optical element 328 may include a laser with a MQW gain layer or photodiode with a stack of positive, intrinsic, and negative layers. As illustrated, the SSC 352 and the active optical element 374 share the substrate 372. In some embodiments, the SSC 352 and the active optical element 374 may be formed from one or more of the same epitaxial layers or in one or more of the same epitaxial processing steps. Accordingly, the system 350 may be or include a monolithically formed active optical element and SSC, a monolithically formed laser and SSC, or a monolithically formed photodiode and SSC.

Figure 3C:
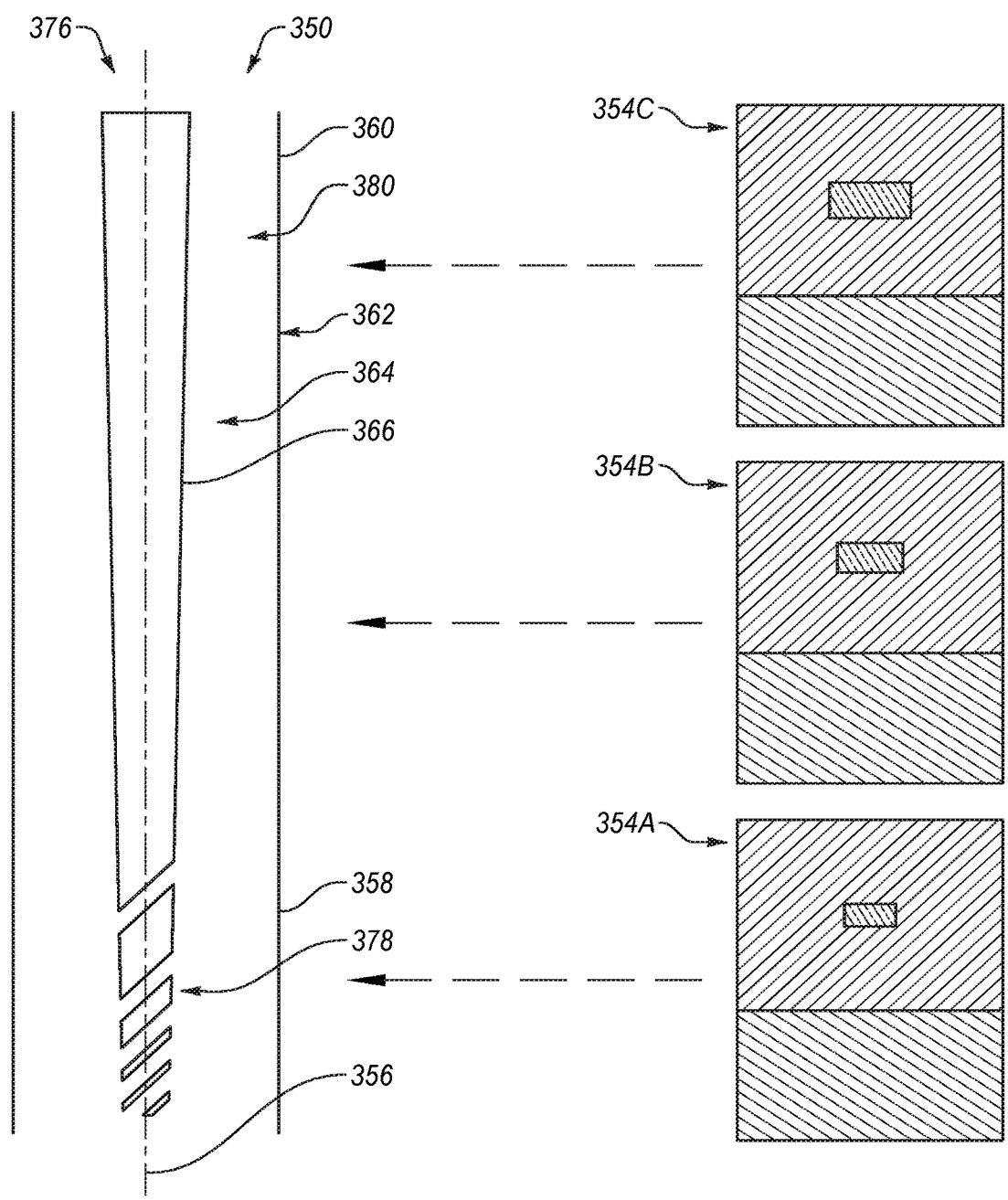
FIG. 3C includes a cross-sectional view of the SSC of FIG. 3B.

FIG. 3C includes a cross-sectional view 376 of the SSC 352 of FIG. 3B, arranged in accordance with at least one embodiment described herein. The cross-sectional view of FIG. 3C is taken in a plane parallel to a top of the substrate 372 in FIG. 3B. FIG. 3C additionally includes the cross-sectional views 354 of the SSC 352 at locations generally indicated by arrows from the cross-sectional views 354.

The cross-sectional view 376 of FIG. 3C shows the waveguide core 366 of the second waveguide structure 364 formed within the first waveguide structure 362. As illustrated in FIG. 3C, the waveguide core 366 includes the grating portion, designated at 378 in FIG. 3C, as well as the remainder portion, designated at 380 in FIG. 3C. The remainder portion 378 is tapered in the lateral direction. Stated another way, a lateral dimension (e.g., a horizontal dimension in FIG. 3C) of the remainder portion 378 decreases from the second end 360 moving toward the first end 358 along the waveguide axis 356.

Figure 4A:
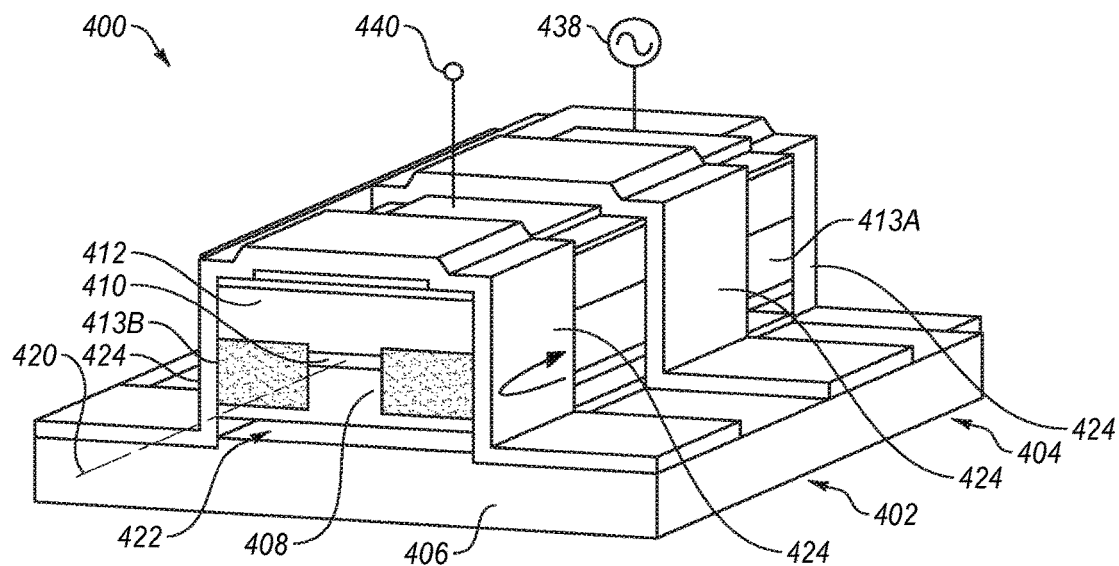
FIG. 4A includes a perspective view of another example optical system that includes a SSC and a laser.
Figure 4B:
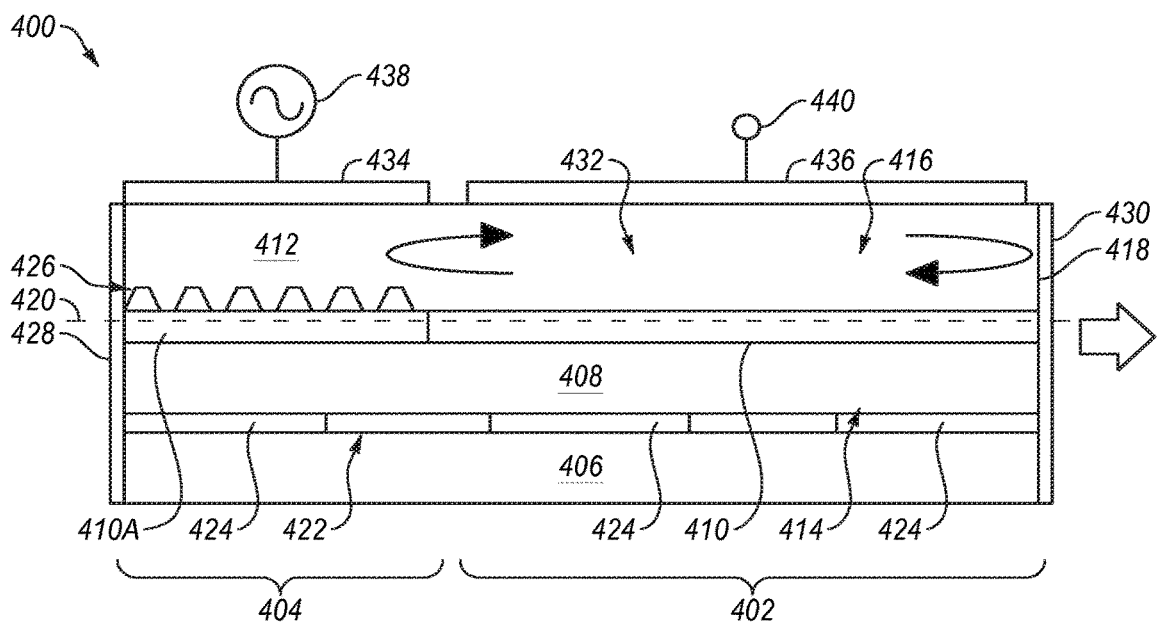
FIG. 4B includes a cross-sectional view of the system of FIG. 4A.

FIG. 4A includes a perspective view of another example optical system 400 (hereinafter "system 400") that includes a SSC 402 and a laser 404, arranged in accordance with at least one embodiment described herein. FIG. 4B includes a cross-sectional view of the system 400 of FIG. 4A, arranged in accordance with at least one embodiment described herein. The SSC 402 may include, be included in, or correspond to other SSCs described herein.

Referring to FIGS. 4A-4B, the laser 404 may include a substrate 406, a lower cladding 408 formed on or above the substrate 406, a waveguide core 410 formed on or above the lower cladding 408, and an upper cladding 412 formed on or above the waveguide core 410. An active layer 410A (FIG. 4A) may be included in the laser 404 within, above, below, or otherwise optically coupled to the waveguide core 410.

In some embodiments, the laser 404 may additionally include two structures 413A, 413B (FIG. 4A) formed in the laser 404 on opposite lateral sides of the active layer 410A. The two structures 413A, 413B may include a semiconductor material that extends continuously through both the laser 404 and the SSC 402. The semiconductor material may be doped or undoped. In an example, the two structures 413A, 413B are undoped in the SSC 402 and are doped in the laser 404 to be current blocking structures in the laser 404.

The SSC 402 may include the substrate 406, a first waveguide structure 414 (FIG. 4B), and a second waveguide structure 416 (FIG. 4B). The first waveguide structure 414 may extend from the laser 404 to a facet end 418 (FIG. 4B) and may include the lower cladding 408 and the upper cladding 412, each of which may extend continuously through both the laser 404 and the SSC 402. One or both of the lower cladding 408 and the upper cladding 412 may be doped in one or both of the laser 404 and the SSC 402. In an example, the lower cladding 408 includes n-doped InP and the upper cladding 412 includes p-doped InP in the laser 404, while the lower and upper claddings 408, 412 are undoped in the SSC 402. In another example, the lower cladding 408 includes n-doped InP, e.g., with doping in a range of $3 \times 10^{17}$ cm$^{-3}$ to $5 \times 10^{17}$ cm$^{-3}$, in both the laser 404 and the SSC 402.

The second waveguide structure 416 may extend from the laser 404 toward, and in some embodiments to, the facet end 418 of the SSC 402. The second waveguide structure 416 includes the waveguide core 410 that is optically coupled to the active layer 410A of the laser 404. The waveguide core 410 may be tapered in one or both of the transversal or lateral directions. As such, a cross-sectional area of the waveguide core 410 normal to a waveguide axis 420 may decrease along the waveguide axis 420 from the laser 404 approaching the facet end 418. Alternatively or additionally, the waveguide core 410 may include a grating portion at or near the facet end 418, such as the grating portions 118, 378 described herein.

The facet end 418 (FIG. 4B) may be a cleaved facet. Alternatively or additionally, the facet end 418 may be angled relative to the waveguide axis 420. For example, rather than the facet end 418 being perpendicular to the waveguide axis 420, or a surface normal of the facet end 418 being parallel to the waveguide axis 420, an angle between the surface normal of the facet end 418 and the waveguide axis 420 may be in a range from, e.g., 1 degree to 14 degrees. Arranging the facet end 418 at an angle to the waveguide axis 420 may reduce reflectivity from the facet end 418 compared to the facet end 418 being perpendicular to the waveguide axis 420.

As illustrated in FIGS. 4A-4B, the lower cladding 408 is spaced apart from the substrate 406 by an air gap 422 such that air clads a bottom surface of the lower cladding 408 in both the laser 404 and the SSC 402. In other embodiments, a step index material layer may be formed between the lower cladding 408 and the substrate 406 in one or both of the laser 404 or the SSC 402.

The system 400 may further include one or more supports 424 that extend from the substrate 406 to mechanically support the lower cladding 408 (and other elements formed above the lower cladding 408) suspended above the substrate 406 with the air gap 422 therebetween. The system 400 includes multiple supports 424 in the illustrated example. The supports 424 may include pillars of InP, silicon dioxide ($SiO_2$), or other suitable material. Example methods to form a laser suspended above a substrate are disclosed in U.S. Pat. No. 8,236,590, which is incorporated herein by reference. Methods disclosed in the '590 Patent may be adapted to form a laser and SSC suspended above a substrate, such as illustrated in FIGS. 4A-4B. An example method is described in greater detail herein.

The SSC 402 and the laser 404 share the substrate 406. Further, the SSC 402 and the laser 404 may be formed from one or more of the same epitaxial layers (e.g., lower and upper claddings 408, 412, waveguide core 410, structures 413A, 413B) or in one or more of the same epitaxial processing steps. Accordingly, the system 400 may be or include a monolithically formed laser and SSC.

The system 400 of FIGS. 4A-4B may leverage the detuned-loading effect to improve performance of the system 400. Additional details regarding the detuned-loading effect are disclosed in U.S. patent application Ser. No. 16/691,549, filed Nov. 21, 2019 and U.S. Pat. No. 10,461,503, both of which are incorporated herein by reference.

As illustrated, the SSC 402 is coupled to a front of the laser 404. The SSC 402 may have a length in a range from 100 to 250 micrometers, such as 120 micrometers. The laser 404 may have a length in a range from 50 to 200 micrometers, or in a range from 80 to 140 micrometers, such as about 100 micrometers.

The active layer 410A of the laser 404 may include a MQW gain layer or other suitable layer configured to convert electrical current to light and the laser 404 may include a DFB grating 426 (FIG. 4B) formed in, on, or above the active layer 410A. The DFB grating 426 may include first and second grating portions with a phase shift in between. The DFB grating 426 may have a kappa×length, e.g., κL, in a range from 1.0 to 1.8, or other suitable κL.

A high reflection (HR) mirror 428 (FIG. 4B) is formed at a rear or back, e.g., on a rear facet, of the laser 404. The HR mirror 428 may be coupled to the rear of the laser 404. The HR mirror 428 may have a reflectivity of 30% or more, 50% or more, 70% or more, or even 90% or more. In other embodiments, a DBR mirror with similar reflectivity (e.g., of 30% or more, 50% or more, 70% or more, or even 90% or more) may be substituted for the HR mirror 428 and may be referred to as an HR DBR mirror. The term "HR mirror" as used herein encompasses HR coatings/mirrors as well as HR DBR mirrors.

A low reflection (LR) mirror 430 (FIG. 4B, omitted from FIG. 4A to show other components) is formed at a front, e.g., on the facet end 418, of the SSC 402. The LR mirror 430 may be coupled to the front of the SSC 402. The LR mirror 430 may have a reflectivity of 15% or less, 10% or less, or even 5% or less, such as 4% or 3%. In some embodiments, the LR mirror 430 has a reflectivity in a range from 0.5% to 15% or in a range from 3% to 8%. An etalon 432 is formed between a portion of the DFB grating 412 at the front of the laser 404 and the LR mirror 430. The system 400 forms a complex-cavity design consisting of a DFB laser itself, e.g., the laser 404, and the etalon 432. The etalon 432 is configured to modify cavity loss dynamically due to frequency chirp as the laser 404 is modulated. The system 400 may be referred to as a DFB+R (e.g., DFB plus (weak) reflection) laser 400.

The DFB+R laser 400 may additionally include a modulation contact 434 and a bias contact 436 electrically coupled to, respectively, the laser 404 and the SSC 402. A modulation signal 438 may be provided through the modulation contact 434 to the laser 404 to modulate the laser 404. A bias 440 may be provided through the bias contact 436 to the SSC 402. Modulation of the laser 404 may modulate the cavity loss of the DFB+R laser 400 and may increase a relaxation oscillation frequency, or Fr, of the DFB+R laser 400.

Figure 5:
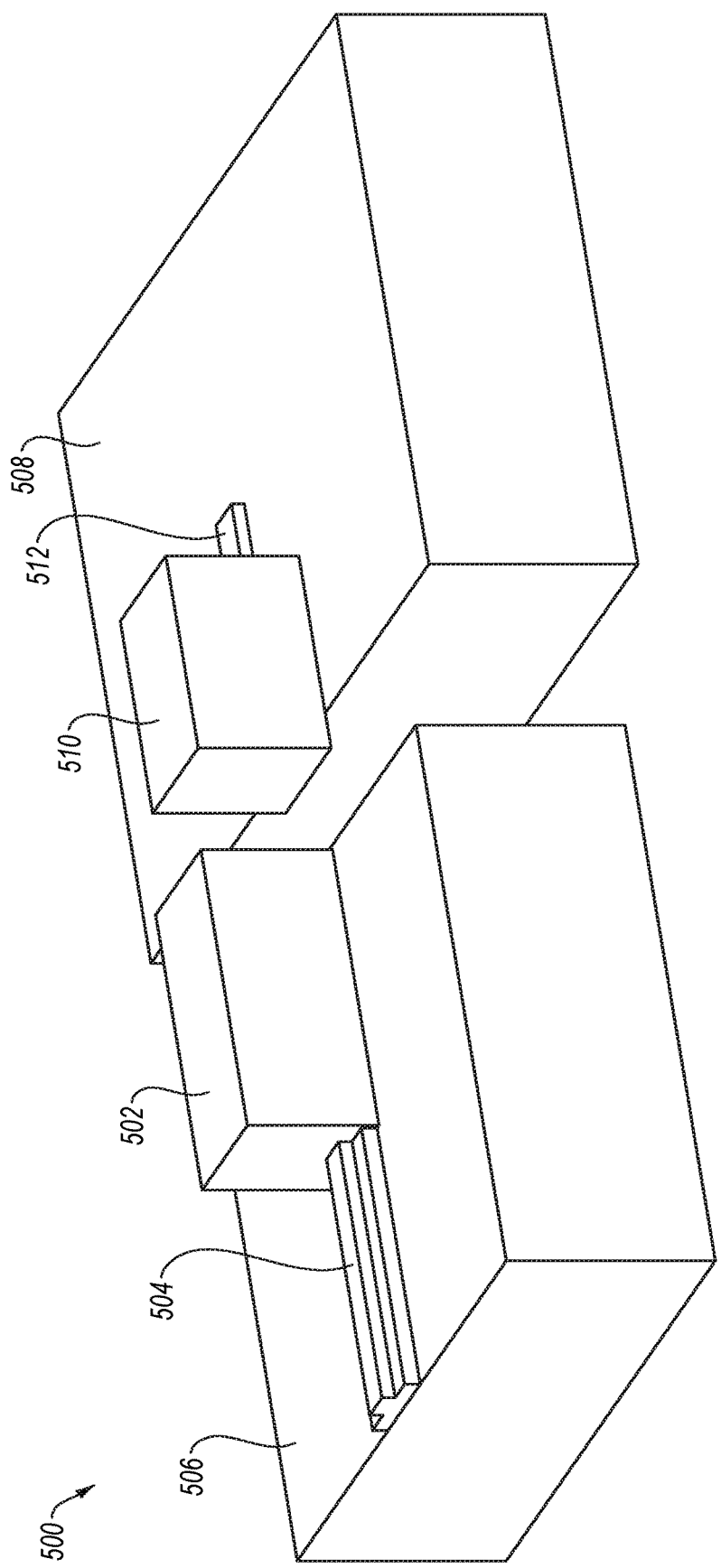
FIG. 5 includes a perspective view of another example optical system that includes a SSC and a laser.

FIG. 5 includes a perspective view of another example optical system 500 (hereinafter "system 500") that includes a SSC 502 and a laser 504, arranged in accordance with at least one embodiment described herein. The SSC 502 and the laser 504 may respectively include, be included in, or correspond to other SSCs and lasers described herein. The SSC 502 and the laser 504 may be formed on or coupled to a substrate 506. In some embodiments, the SSC 502 and the laser 504 are monolithically formed together. In some embodiments, the SSC 502 and the laser 504 are formed as discrete components and subsequently assembled together.

The system 500 of FIG. 5 may further include a Si PIC 508 and an edge coupler 510. The Si PIC may include one or more Si or silicon nitride (SiN) waveguides formed therein. Each of the Si or SiN waveguides may include a Si or SiN waveguide core surrounded by cladding of lower refractive index, such as $SiO_2$ in this example. FIG. 5 includes one Si waveguide 512 for illustration purposes. The Si waveguide 512 may be optically coupled to one or more other waveguides or passive or active optical devices formed in or coupled to the Si PIC.

The edge coupler 510 may be positioned to receive light output by the SSC 502 and couple the light into the Si PIC 510, such as into the Si waveguide 512. In an example, the edge coupler 510 may adiabatically couple light into the Si waveguide. Details regarding adiabatic coupling of light into a Si PIC are disclosed in US Patent Publication No. 2018/0156992, which is incorporated herein by reference.

Figure 6:
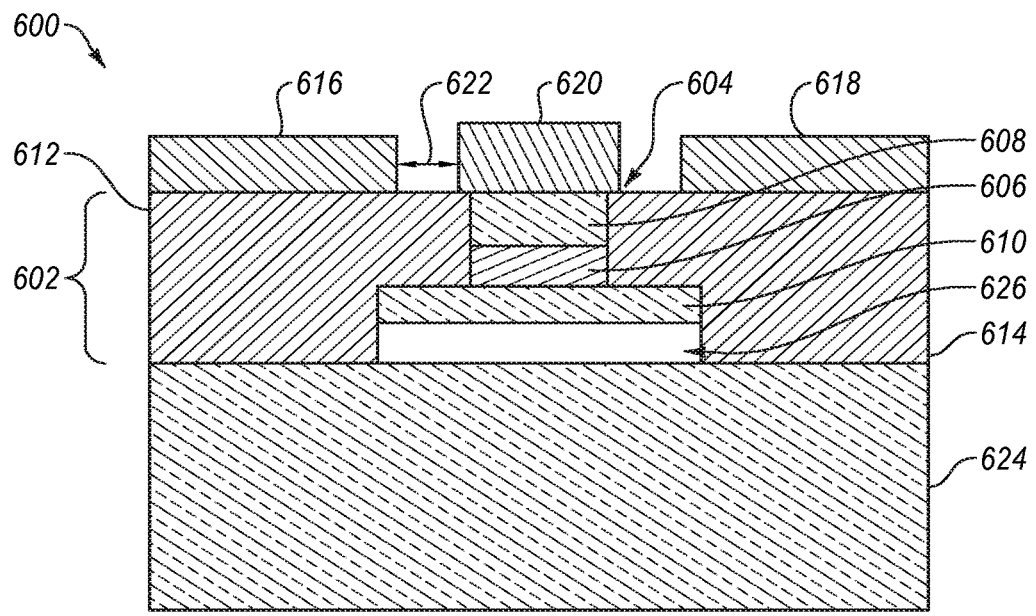
FIG. 6 illustrates an example laser with a lateral junction BH.

Some embodiments herein may include a laser with a lateral junction buried heterostructure (BH) formed in the laser. Such a laser may be monolithically formed with one or more of the SSCs described herein. Alternatively or additionally, such a laser may be formed separately from the SSC and the two may subsequently be assembled. FIG. 6 illustrates an example laser 600 with a lateral junction BH 602, arranged in accordance with at least one embodiment described herein. In some embodiments, the laser 600 is monolithically formed with a SSC.

The laser 600 includes a ridge structure 604 that extends lengthwise along a waveguide axis (in and out of the page in FIG. 6). The ridge structure 604 includes an active layer 606, such as a MQW gain layer, positioned vertically within the ridge structure 604 between upper and lower cladding 608, 610.

The laser 600 further includes p-doped InP 612 and n-doped InP 614, each of which extends lengthwise parallel to the waveguide axis. The p-doped InP 612 is positioned laterally adjacent to a first side (e.g., to the left side in FIG. 6) of the ridge structure 604. The n-doped InP 614 is positioned laterally adjacent to a second side (e.g., to the right side in FIG. 6) of the ridge structure 604. The lateral junction BH 602 includes the ridge structure 604 with the p-doped and n-doped InP 612, 614 disposed laterally on opposite sides of the ridge structure 604.

An anode 616 may be formed on the p-doped InP 612. A cathode 618 may be formed on the n-doped InP 614. Current may be injected into the laser 600 through the anode 616, from which it travels generally laterally through the ridge structure 604 to the cathode 618.

A dielectric layer 620, such as $SiO_2$ or other suitable material layer, may be formed on the ridge structure 604. The dielectric layer 620 may serve as a passivation layer. The dielectric layer 620 may have a width in a range from 0.5 micrometers to 2 micrometers in some embodiments, or less than 0.5 or greater than 2 micrometers in other embodiments. The anode 616 may be spaced apart from the dielectric layer 620 by a gap 622 which may extend lengthwise along some or all of a length of the anode 616 or the dielectric layer 620. The gap 622 may be about 0.5 micrometers or other suitable distance, such as in a range from 0.25 micrometers to 2 micrometers. The cathode 618 may also be spaced apart from the dielectric layer 620 by a gap of the same or different distance.

The lateral junction BH 602 may be formed on a substrate 624, such as an InP substrate. In some embodiments, an air gap 626 is formed between the lower cladding 610 and the substrate 624. The lateral junction BH 602 (as well as any layers or structures formed in, on, or above it) may be mechanically supported spaced apart from the substrate 624 by one or more supports, such as one or more pillars of InP. In an example embodiment, such pillars may be formed in the p-doped InP 612 and the n-doped InP 614.

A SSC may be monolithically formed with the laser 600 that may include, be included in, or correspond to other SSCs described herein. The SSC may have a waveguide core optically coupled to the active layer 606, the waveguide core positioned between upper and lower cladding. Alternatively or additionally, the ridge structure 604 may extend through the SSC with InP positioned on opposite lateral sides of the ridge structure 604. Within the SSC, the waveguide core, the upper and lower cladding, the InP, or any combination thereof may include the same semiconductor materials or layers as in the laser 600, with the same or different doping characteristics as in the laser 600.

Figure 7A:
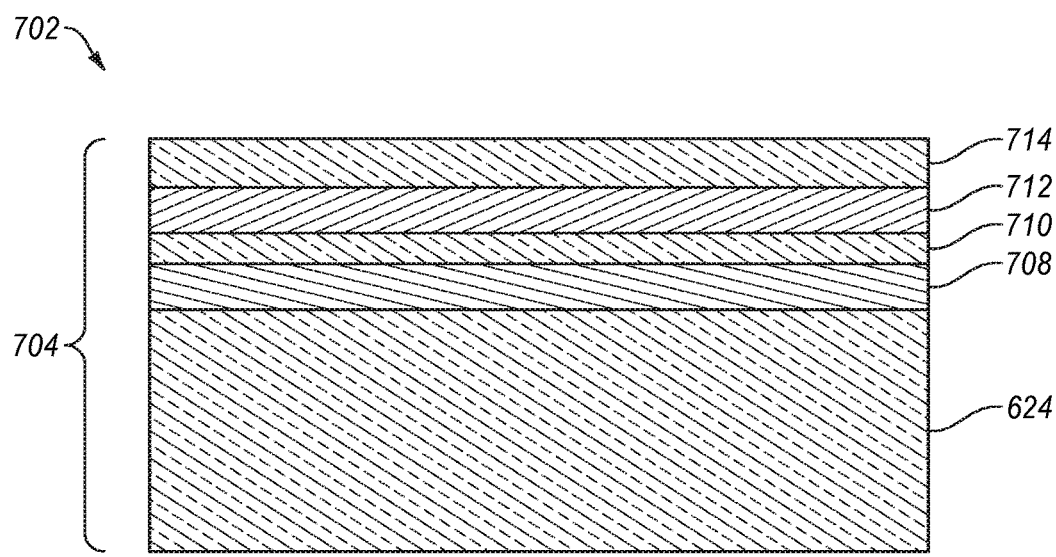

FIGS. 7A-7H illustrate an example set of epitaxial processing steps to form the laser 600 of FIG. 6 monolithically with a SSC, arranged in accordance with at least one embodiment described herein. Referring to FIG. 7A, at step 702, a material stack 704 may be built up. The Material stack 704 may include the substrate 624, a sacrificial layer 708, a lower cladding layer 710, an active layer (in the laser) or waveguide core layer (in the SSC) 712, and an upper cladding layer 714.

The substrate 624 may include an InP substrate. The sacrificial layer 708 may include indium gallium aluminum arsenide (InGaAlAs), indium gallium arsenide (InGaAs), indium aluminum arsenide (InAlAs), or other suitable material. The lower cladding layer 710 may include doped or undoped InP. The active layer or waveguide core layer 712 may include a MQW gain layer. The upper cladding layer 714 may include doped or undoped InP. One or more of the foregoing layers may be doped or otherwise processed differently in the laser than in the SSC, or the same in both the laser and the SSC. The doping or other processing may be implemented as the layers of the material stack 704 are built up.

Figure 7B:
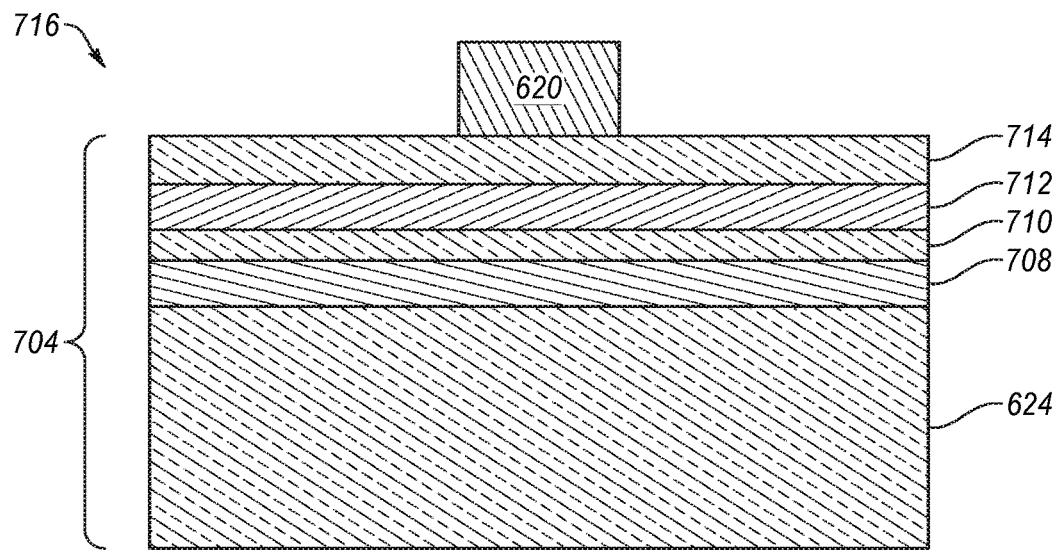

Referring to FIG. 7B, at step 716, a dielectric layer 620, such as a layer of $SiO_2$ with a thickness of about 0.5 micrometers, may be formed on the upper cladding layer 714. The dielectric layer 620 may have a width in a range from 0.5 micrometers to 2 micrometers or other suitable width. The dielectric layer 620 is formed where the ridge structure 604 of FIG. 6 is formed in subsequent steps.

Figure 7C:
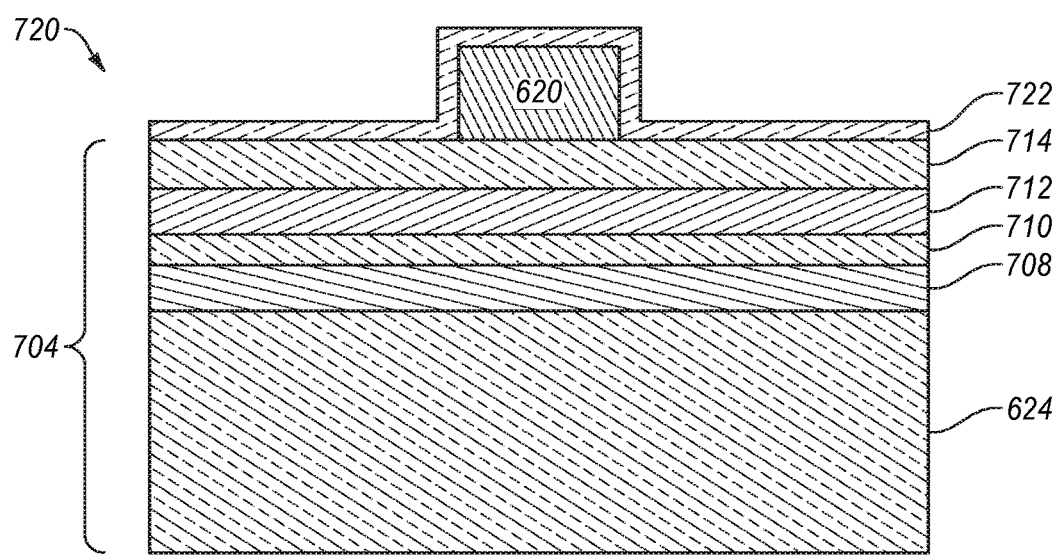

Referring to FIG. 7C, at step 720, a dielectric layer 722, such as a layer of $SiO_2$ with a thickness of about 0.5 micrometers, may be formed on the upper cladding layer 714 and the dielectric layer 620.

Figure 7D:
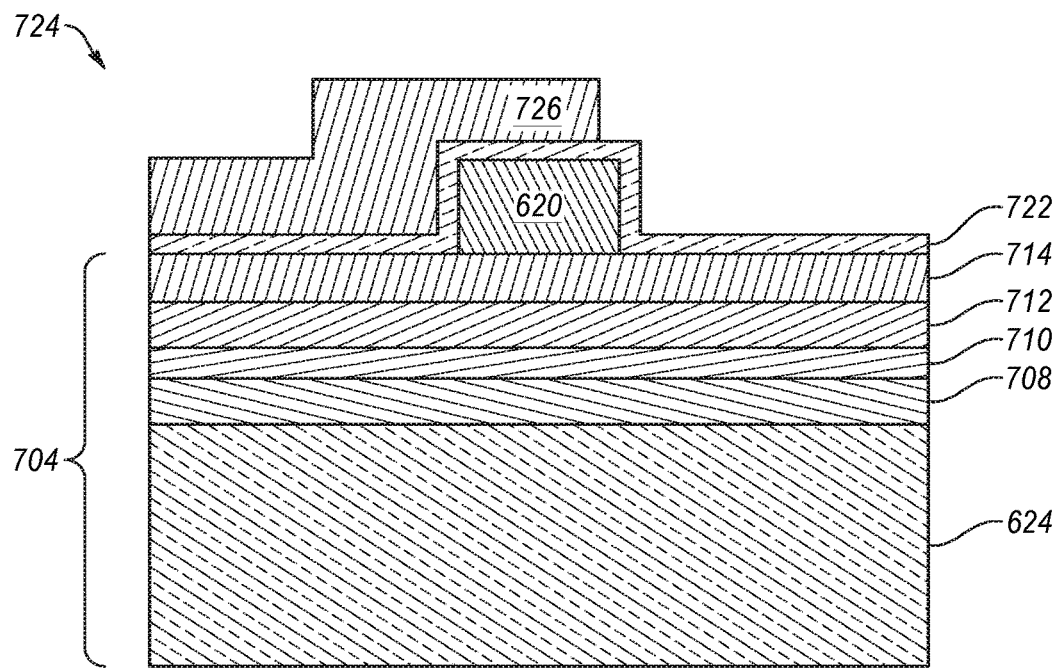

Referring to FIG. 7D, at step 724, a photoresist 726 is selectively applied to the thin dielectric layer 722.

Figure 7E:
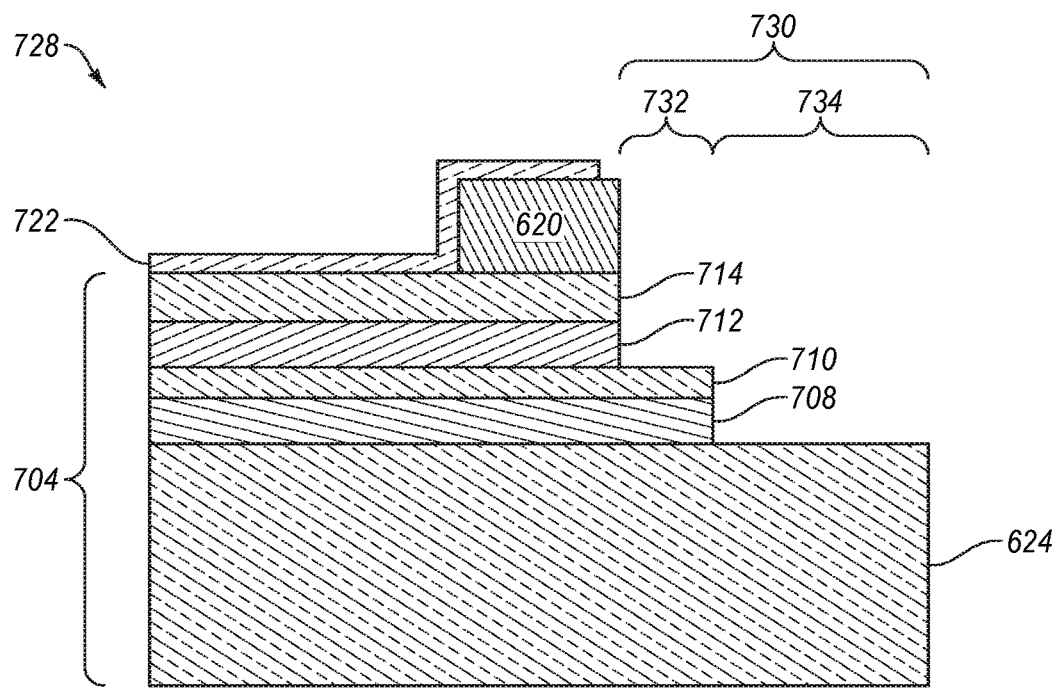

Referring to FIG. 7E, at step 728, the material stack 704 is partially etched in areas not covered by the photoresist 726 and the photoresist 726 is removed. The etching in some embodiments may include two or more etching steps to etch partially through the material stack 704 to different depths in different areas. For example, one etching step may etch through the upper cladding layer 714 and the active layer or waveguide core layer 712 in an area 730. Another photoresist (not shown) may then be applied to an area 732. Finally, a second etching step may etch through the lower cladding layer 710 and the sacrificial layer 708 in an area 734. After completion of etching the photoresist is removed.

Figure 7F:
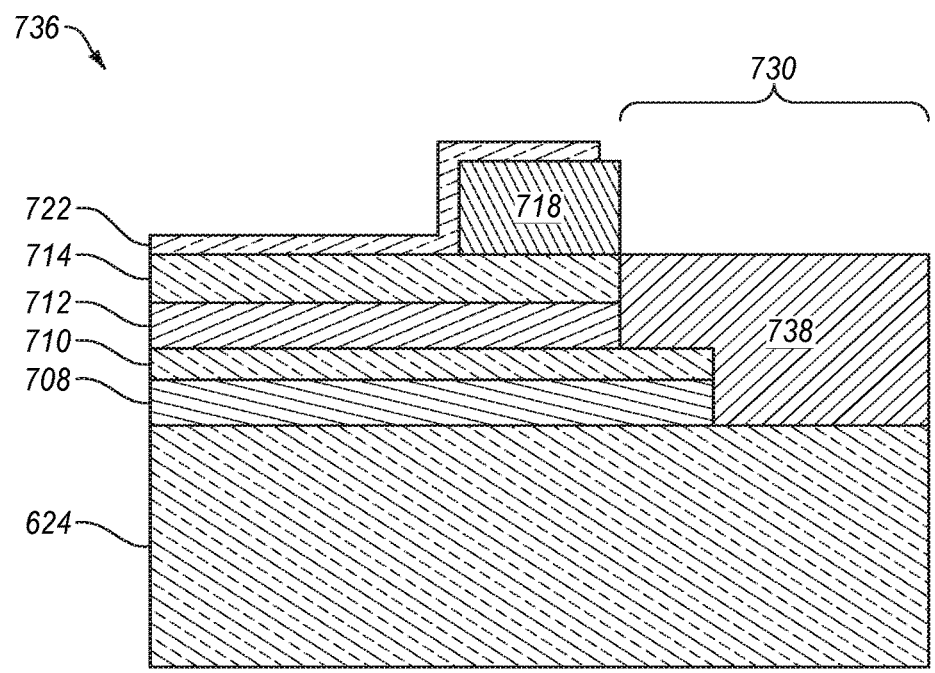

Referring to FIG. 7F, at step 736, an InP structure 738 is formed in the area 730. The InP structure 738 may be doped in the laser, such as with n-doping. The InP structure 738 may be undoped in the SSC.

Referring to FIG. 7G, at step 740, formation of the ridge structure 604 is completed with another set of photoresist and etching steps and formation of another InP structure 742. This results in formation of the lower cladding 610, the active layer 606 in the laser (or waveguide core layer in the SSC), the upper cladding 608, the p-doped InP 612 in the laser, and the n-doped InP 614 in the laser. The InP structure 742 may be doped in the laser, such as with p-doping, to form the p-doped InP 612 in the laser. The InP structure 742 may be undoped in the SSC.

In addition, as shown in an overhead view 744 of FIG. 7G, various dry etched holes 745 (only some of which are labeled for simplicity) may be formed through portions of the InP structures 738/612, 742/614 and the lower cladding 610 to remaining sacrificial layer 708.

Referring to FIG. 7H, at step 746, the sacrificial layer 708 may be exposed to an etchant through the dry etched holes 745 to etch away the sacrificial layer 708 beneath the lower cladding 610 and form the air gap 626.

Unless specific arrangements described herein are mutually exclusive with one another, the various implementations described herein can be combined in whole or in part to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. An optical system, comprising:
an active optical element that includes an active layer configured to convert electrical current to light or to convert light to electrical current; and
a spot-size converter, the spot-size converter comprising:
a waveguide structure comprising indium phosphide that extends longitudinally along a waveguide axis from a first end to a second end, the second end being proximate to and optically coupled to the active optical element, the waveguide structure including a cladding and a core within the cladding, wherein the core has a first cross-sectional area in a first plane normal to the waveguide axis at the first end, a second cross-sectional area in a second plane normal to the waveguide axis at the second end, and the second cross-sectional area is larger than the first cross-sectional area, wherein the core comprises a grating portion at the first end, the grating portion including grating lines of core material arranged at an angle to the waveguide axis, the angle between about 30-80 degrees,
wherein the waveguide structure is configured to support a first optical mode at the first end and a second optical mode at the second end, the first optical mode has a larger diameter than the second optical mode, and wherein the waveguide structure is spaced apart from a substrate by an index step material layer.

2. The optical system of claim 1, wherein the active optical element includes a laser, the optical system further comprising:
a silicon photonic integrated circuit; and
an edge coupler positioned to receive light output by the spot-size converter and couple the light into the silicon photonic integrated circuit.

3. The optical system of claim 1, wherein the cladding extends into the active optical element.

4. The optical system of claim 1, wherein the cladding extends through the active optical element.

5. The optical system of claim 1, wherein the cladding extends continuously through the active optical element.

6. The optical system of claim 1, wherein the spot-size converter and the active optical element share at least one epitaxial layer.

7. The optical system of claim 1, wherein the spot-size converter and the active optical element are at least partially formed in one or more of the same epitaxial processing steps.

8. The optical system of claim 7, wherein the spot-size converter and the active optical element are monolithically formed.

9. The optical system of claim 1, wherein the index step material is air.

10. The optical system of claim 1, wherein the index step material comprises doped indium phosphide.

11. The optical system of claim 1, further comprising a first support supporting the waveguide structure at the first end.

12. The optical system of claim 11, further comprising a second support supporting the waveguide structure at the second end and air between the first support and the second support.

13. The optical system of claim 11, wherein the first support has a lateral dimension perpendicular to the waveguide axis that is wider than the waveguide structure.

14. The optical system of claim 1, wherein the active optical element is a laser, the optical system further comprising:
a distributed feedback (DFB) grating formed in the laser and optically coupled to the active layer such that the laser is a DFB laser; and
an etalon optically coupled to the DFB laser, the etalon including a low reflectivity mirror at a facet end of the spot-size converter and an end portion of the DFB grating that is nearer to the spot-size converter than a remainder of the DFB grating.

15. The optical system of claim 1, wherein the cladding surrounds the core, the cladding being surrounded by air.

16. The optical system of claim 1, wherein the first end comprises a cleaved facet with a surface normal arranged at an angle between 1 to 14 degrees relative to the waveguide axis.

17. An optical system, comprising:
an active optical element that includes an active layer configured to convert electrical current to light or to convert light to electrical current; and
a spot-size converter, the spot-size converter comprising:
a waveguide structure comprising indium phosphide that extends longitudinally along a waveguide axis from a first end to a second end, the second end being proximate to and optically coupled to the active optical element, the waveguide structure including a cladding and a core within the cladding, wherein the core has a first cross-sectional area in a first plane normal to the waveguide axis at the first end, a second cross-sectional area in a second plane normal to the waveguide axis at the second end, and the second cross-sectional area is larger than the first cross-sectional area; and a first support supporting the waveguide structure at the first end, wherein the waveguide structure is configured to support a first optical mode at the first end and a second optical mode at the second end, the first optical mode has a larger diameter than the second optical mode, and wherein the waveguide structure is spaced apart from a substrate by an index step material layer, and wherein the first support and the waveguide structure are formed from a same epitaxial layer.

18. An optical system, comprising:

an active optical element that includes an active layer configured to convert electrical current to light or to convert light to electrical current; and a spot-size converter, the spot-size converter comprising:

a waveguide structure comprising indium phosphide that extends longitudinally along a waveguide axis from a first end to a second end, the second end being proximate to and optically coupled to the active optical element, the waveguide structure including a cladding and a core within the cladding, wherein the core has a first cross-sectional area in a first plane normal to the waveguide axis at the first end, a second cross-sectional area in a second plane normal to the waveguide axis at the second end, and the second cross-sectional area is larger than the first cross-sectional area; and two current blocking structures formed in the active optical element on opposite lateral sides of the active layer, the current blocking structures including a semiconductor material that extends continuously through the active optical element and the spot-size converter, wherein the waveguide structure is configured to support a first optical mode at the first end and a second optical mode at the second end, the first optical mode has a larger diameter than the second optical mode, and wherein the waveguide structure is spaced apart from a substrate by an index step material layer.

19. The optical system of claim 18, wherein the core comprises a grating portion at the first end, the grating portion including grating lines of core material arranged at an angle to the waveguide axis, the angle between about 30-80 degrees.

20. An optical system, comprising:

an active optical element that includes an active layer configured to convert electrical current to light or to convert light to electrical current; and a spot-size converter, the spot-size converter comprising:

a waveguide structure comprising indium phosphide that extends longitudinally along a waveguide axis from a first end to a second end, the second end being proximate to and optically coupled to the active optical element, the waveguide structure including a cladding and a core within the cladding, wherein the core has a first cross-sectional area in a first plane normal to the waveguide axis at the first end, a second cross-sectional area in a second plane normal to the waveguide axis at the second end, and the second cross-sectional area is larger than the first cross-sectional area, wherein the waveguide structure is configured to support a first optical mode at the first end and a second optical mode at the second end, the first optical mode has a larger diameter than the second optical mode, and wherein the waveguide structure is spaced apart from a substrate by an index step material layer wherein the active optical element is a laser, the optical system further comprising:

a lateral junction buried heterostructure (BH) formed in the laser, the lateral junction BH including:

a ridge structure that extends lengthwise along the waveguide axis, the active layer positioned within the ridge structure;

p-doped indium phosphide that extends lengthwise parallel to the waveguide axis, the p-doped indium phosphide positioned laterally adjacent to a first side of the ridge structure; and n-doped indium phosphide that extends lengthwise parallel to the waveguide axis, the n-doped indium phosphide positioned laterally adjacent to a second side of the ridge structure that is opposite the first side.

* * * * *